US008866193B2

(12) United States Patent
Briere

(10) Patent No.: US 8,866,193 B2
(45) Date of Patent: *Oct. 21, 2014

(54) METHOD FOR FABRICATING A MONOLITHIC INTEGRATED COMPOSITE GROUP III-V AND GROUP IV SEMICONDUCTOR DEVICE

(71) Applicant: International Rectifier Corporation, El Segundo, CA (US)

(72) Inventor: Michael A. Briere, Scottsdale, AZ (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/049,564

(22) Filed: Oct. 9, 2013

(65) Prior Publication Data
US 2014/0035005 A1     Feb. 6, 2014

Related U.S. Application Data

(60) Continuation of application No. 13/028,143, filed on Feb. 15, 2011, now Pat. No. 8,557,644, which is a division of application No. 12/455,117, filed on May 28, 2009, now Pat. No. 7,915,645.

(51) Int. Cl.
| | | |
|---|---|---|
| *H01L 31/0328* | (2006.01) | |
| *H01L 31/0336* | (2006.01) | |
| *H01L 31/109* | (2006.01) | |
| *H01L 31/072* | (2012.01) | |
| *H01L 29/739* | (2006.01) | |

(52) U.S. Cl.
USPC .... 257/195; 257/200; 257/201; 257/E27.027; 438/167; 438/172; 438/572; 438/598; 438/604

(58) Field of Classification Search
None
See application file for complete search history.

(56) References Cited

U.S. PATENT DOCUMENTS

| | | | | |
|---|---|---|---|---|
| 4,278,474 A | * | 7/1981 | Blakeslee et al. | 136/249 |
| 6,974,693 B2 | * | 12/2005 | Barlocchi et al. | 435/288.5 |
| 2003/0017683 A1 | | 1/2003 | Emrick | |
| 2003/0022430 A1 | | 1/2003 | Emrick | |
| 2003/0140317 A1 | | 7/2003 | Brewer | |
| 2003/0207589 A1 | | 11/2003 | Li | |

* cited by examiner

*Primary Examiner* — Zandra Smith
*Assistant Examiner* — Khanh Duong
(74) *Attorney, Agent, or Firm* — Farjami & Farjami LLP

(57) ABSTRACT

According to one disclosed embodiment, a monolithic vertically integrated composite device comprises a double sided semiconductor substrate having first and second sides, a group IV semiconductor layer formed over the first side and comprising at least one group IV semiconductor device, and a group III-V semiconductor body formed over the second side and comprising at least one group III-V semiconductor device electrically coupled to the at least one group IV semiconductor device. The composite device may further comprise a substrate via and/or a through-wafer via providing electric coupling. In one embodiment, the group IV semiconductor layer may comprise an epitaxial silicon layer, and the at least one group IV semiconductor device may be a combined FET and Schottky diode (FETKY) fabricated on the epitaxial silicon layer. In one embodiment, the at least one group semiconductor device may be a III-nitride high electron mobility transistor (HEMT).

19 Claims, 3 Drawing Sheets

METHOD FOR FABRICATING A MONOLITHIC INTEGRATED COMPOSITE GROUP III-V AND GROUP IV SEMICONDUCTOR DEVICE

This is a divisional of application Ser. No. 12/455,117 filed May 28, 2009.

BACKGROUND OF THE INVENTION

Definition

In the present application, "group III-V semiconductor" refers to a compound s semiconductor that includes at least one group III element and at least one group V element, such as, but not limited to, gallium nitride (GaN), gallium arsenide (GaAs), indium aluminum gallium nitride (InAlGaN), indium gallium nitride (InGaN) and the like. Analogously, "III-nitride semiconductor" refers to a compound semiconductor that includes nitrogen and at least one group III element, such as, but not limited to, GaN, AlGaN, InN, AlN, InGaN, InAlGaN and the like.

1. Field of the Invention

The present invention is generally in the field of semiconductors. More specifically, the present invention is in the field of Fabrication of compound semiconductor devices.

2. Background Art

Increased diversity in the types of materials used for semiconductor device fabrication have made integration of conventional silicon devices with more recent generations of non-silicon high voltage devices challenging. For example, although it may be highly desirable to use a silicon or other conventional group IV semiconductor device to control a III-nitride transistor, a conventional approach to doing so typically requires that the two distinct device types, each fabricated using different active semiconductor materials on different dies, be co-packaged, rather than share a single die in common.

Unfortunately, this conventional approach to implementing group IV semiconductor devices in combination with non-group IV devices entails several significant drawbacks. For example, because the separate devices are typically fabricated separately on separate dies, their combination requires more space and is more expensive than if the devices were to he integrated on a single die. In addition, the requirement that the separate dies be electrically coupled in packaging, typically by wire bonding the dies together, introduces reliability and performance constraints flowing from the physical durability of the bonds, as well as parasitic inductances introduced by the wires themselves that may effectively decouple the separate devices at high switching speeds. Moreover, because the individual devices are fabricated separately on separate dies, particular pairs or groups of individual devices combined for co-packaging may be less than ideally matched, resulting in sub-optimal performance of the composite device.

Thus, there is a need to overcome the drawbacks and deficiencies in the art by providing a solution enabling effective and efficient integration of a group III-V semiconductor device with a group IV semiconductor device on a single die, i.e., their monolithic integration.

SUMMARY OF THE INVENTION

A monolithic vertically integrated composite group III V and group IV semiconductor device and method for fabricating same, substantially as shown in and/or described in connection with at least one of the figures, as set forth more completely in the claims.

DETAILED DESCRIPTION OF THE INVENTION

Figure 1:
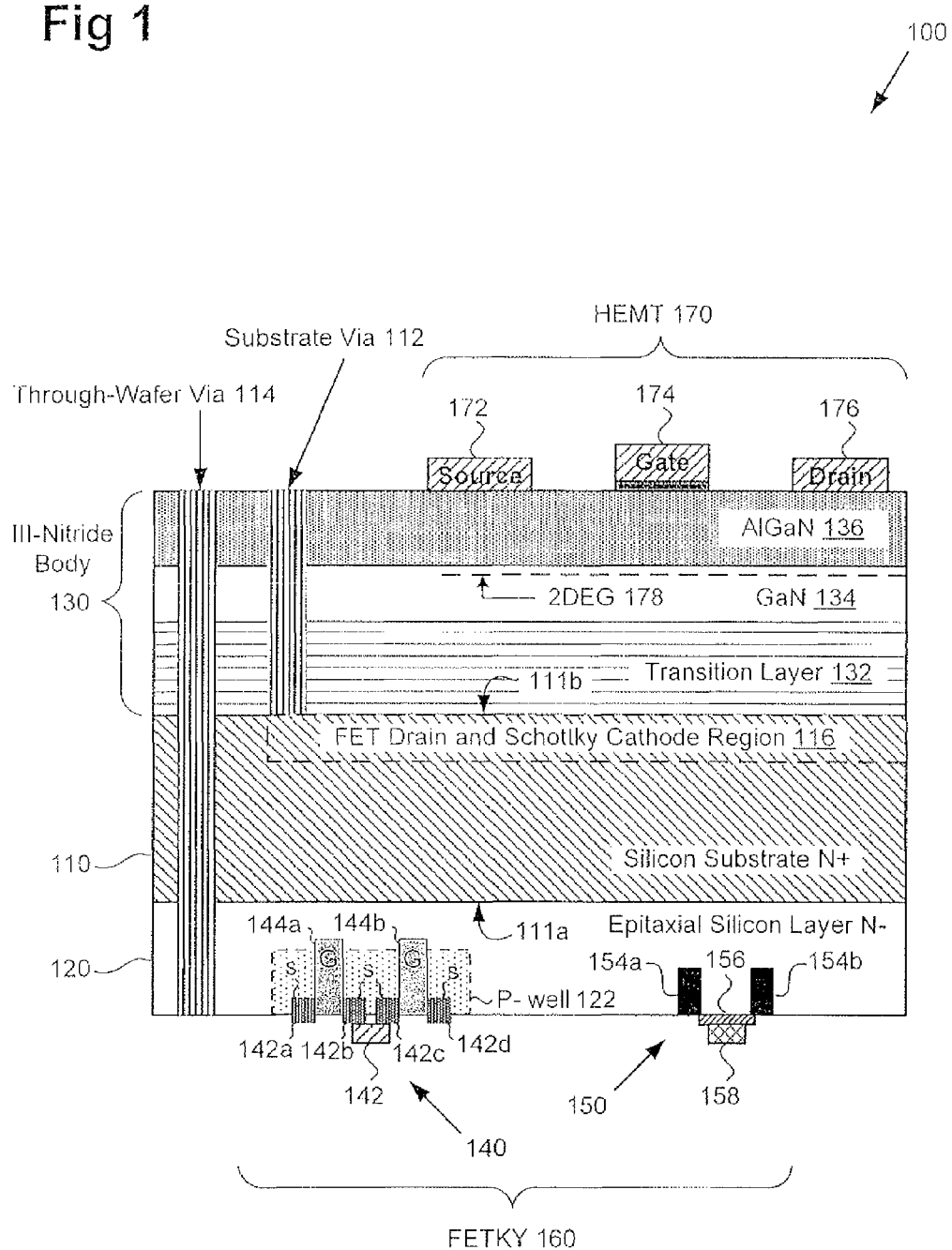
FIG. 1 is a block diagram showing a monolithic vertically integrated composite group III-V and group IV semiconductor device, according to one embodiment of the present invention.

The present invention is directed to a monolithic vertically integrated composite group III-V and group IV semiconductor device and method for fabricating same. Although the invention is described with respect to specific embodiments, the principles of the invention, as defined by the claims appended herein, can obviously be applied beyond the specifically described embodiments of the invention described herein. Moreover, in the description of the present invention, certain details have been left out in order to not obscure the inventive aspects of the invention. The details left Out are within the knowledge of a person of ordinary skill in the art.

The drawings in the present application and their accompanying detailed description are directed to merely example embodiments of the invention. To maintain brevity, other embodiments of the invention, which use the principles of the present invention, are not specifically described in the present application and are not specifically illustrated by the present drawings. It should be borne in mind that, unless noted otherwise, like or corresponding elements among the figures may be indicated by like or corresponding reference numerals.

FIG. 1 is a block diagram showing a monolithic vertically integrated composite group III-V and group IV semiconductor device, according to one embodiment of the present invention. Composite structure 100, in FIG. 1, shows a specific implementation of the present inventive principles. It should be understood that particular details such as the materials used to form composite structure 100, the semiconductor devices incorporated in composite structure 100, the techniques used to electrically couple the individual devices, and the overall functionality of the composite device, for example, are provided for conceptual clarity, and should not be interpreted as limitations. In addition, it is noted that FIG. 1 is not drawn to scale, so that some of the features shown may be depicted as either larger or smaller relative to other features than would typically he the case in practice.

In the specific example provide in FIG. 1, composite structure 100 comprises a monolithic vertically integrated composite III-nitride and silicon semiconductor device. More specifically, composite structure 100 includes double sided silicon substrate 110 having first side 111a and second side 111b. Composite structure 100 further includes epitaxial silicon layer 120 which, for the purpose of illustrating a specific example of: the application of the present invention, is shown as having silicon based combination FET and Schottky diode (also referred to as "FETKY" in the present application) 160, formed over first side 111a of silicon substrate 110. In addition, composite structure 100 includes III-nitride semiconductor body 130 comprising, for the purpose of a specific example, a III-nitride high electron mobility transistor (HEMT) 170, formed over second side 111b of silicon substrate 110.

One or more metallization layers included in composite structure 100 (not shown in FIG. 1), together with substrate via 112 and through-wafer via 114, electrically couple III-nitride HEMT 170 to silicon FETKY 160. More generally, composite structure 100 may be seen. to correspond to a monolithic vertically integrated composite of one or more group III-V semiconductor devices, e.g., III-nitride HEMT 170, electrically coupled to one or more group IV semiconductor devices, e.g., silicon FETKY 160, wherein both device types share silicon substrate 110 in common.

Exemplary composite structure 100 will be further described by reference to flowchart 200, in FIG. 2, which describes the steps, according to one embodiment of s the present invention, of a method for fabricating a monolithic vertically integrated composite group III-V and group IV semiconductor device. It is noted that certain details and features have been left out of flowchart 200 that are apparent to a person of ordinary skill in the art. For example, a step may comprise one or more substeps or may involve specialized equipment or materials, as known in the art. While steps 210 through 260 indicated in flowchart 200 are sufficient to describe one embodiment of the present invention, other embodiments of the invention may utilize steps different from those shown in flowchart 200. It is contemplated that the processing steps of the present exemplary method take place at a temperature below approximately 950° C., in order to prevent decomposition of the group III-V semiconductor materials, e.g., GaN and AlGaN, used to fabricate portions of the composite device.

Beginning with step 210 of flowchart 200 and referring to FIG. 1, step 210 of flowchart 200 comprises providing double sided finished, or polished, silicon substrate 110 having finished first side 111a and finished second side 111b opposite first side 111a. As shown in FIG. 1, use of a double sided silicon substrate suitable for processing on both first side 111a and second side 111b assists in enabling monolithic vertical integration of the semiconductor devices formed over each respective side. Although in the embodiment of FIG. 1, silicon substrate 110 is shown as a unitary silicon substrate, in other embodiments, silicon substrate 110 may be a double sided silicon on insulator (SOT) substrate comprising two silicon substrate layers bonded to one another by an insulator layer, for example.

Figure 2:
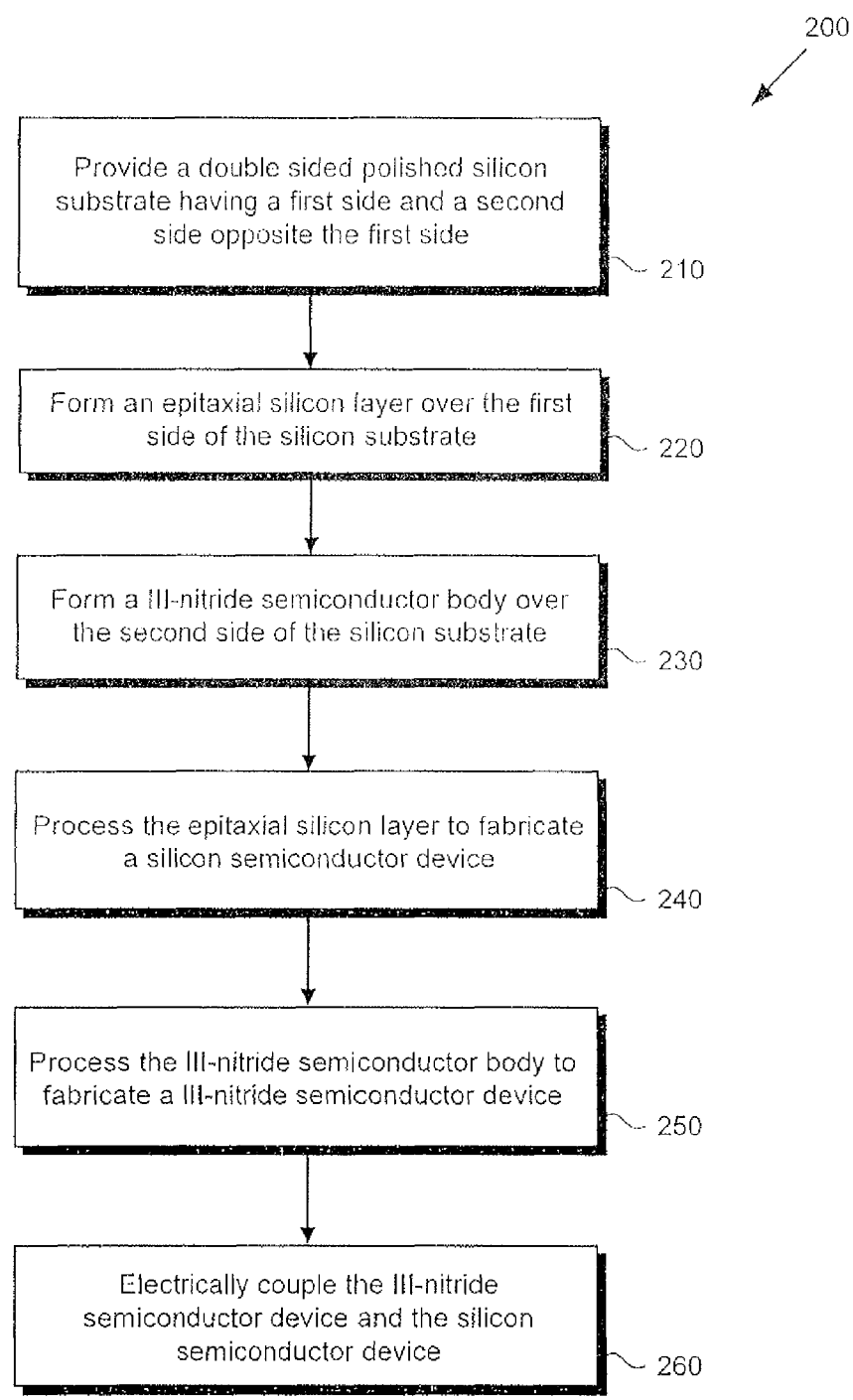
FIG. 2 is a flowchart presenting a method for fabricating a monolithic vertically integrated composite group and group IV semiconductor device, according to one embodiment of the present invention.

Continuing with step 220 of FIG. 2, step 220 of flowchart 200 comprises forming epitaxial silicon layer 120 over first side 111a of silicon substrate 110. Formation of epitaxial silicon layer 120 may be performed by any suitable method, as known in the art, such as chemical vapor deposition (CVD) or molecular beam epitaxy (MBE), for example. As shown in FIG. 1, epitaxial silicon layer 120 is shown to have N-conductivity, and to be formed over first side 111a of silicon substrate 110 having conductivity.

More generally, however, formation of epitaxial silicon layer 120 in step 220 of flowchart 200 corresponds to formation of any suitable group IV semiconductor active layer over first side 111a. Thus, in other embodiments, layer 120 need not be silicon, and/or need not be formed through epitaxial growth. For example, in one embodiment, layer 120 may comprise either a strained or unstrained germanium layer formed on first side 111a of silicon substrate 110. Moreover, the conductivity type of layer 120 may be appropriately adapted according to the conductivity type of semiconductor substrate 110 and the particular semiconductor devices contemplated for fabrication on layer 120.

Moving to step 230 of flowchart 200, step 230 comprises forming III-nitride semiconductor body 130 over second side 111b of silicon substrate 110. As shown in FIG. 1, III-nitride semiconductor body 130 comprises a plurality of III nitride layers, which may include transition layer 132, GaN layer 134, and AlGaN layer 136. Transition layer 132 may itself correspond to a plurality of distinguishable layers mediating the lattice transition from silicon substrate 110 to GaN layer 134. For example, transition layer 132 may include an AlN layer formed on silicon substrate 110, and a series of AlGaN layers comprising progressively less aluminum and more gallium, until a suitable transition to GaN layer 134 is achieved.

The active region of III-nitride semiconductor body 130 is represented in FIG. 1 by GaN layer 134 and AlGaN layer 136, which arc typically not doped, and meet to form a heterojunction interface giving rise to two-dimensional electron gas (2DEG) 178. GaN layer 134 and AlGaN layer 136 may be formed during step 230 using any of a number of to conventional approaches. For example, GaN layer 134 and AlGaN layer 136 may be formed using MBE, metal-organic chemical vapor deposition (MOCVD), or hydride vapor phase epitaxy (HVPE), to name a few suitable techniques. As noted previously, FIG. 1 is not drawn to scale. For instance, although GaN layer 134 and AlGaN layer 136 typically have distinctly different respective thicknesses such as, for example, thicknesses of approximately 1500 Å for GaN layer 134 and of approximately 150 Å for AlGaN layer 136, those layers are shown as having comparable thicknesses in FIG. 1.

Although the embodiments of FIG. 1 and flowchart 200 refer to III-nitride body 130, more generally, body 130 may be from group III-V semiconductor materials, as described in the "Definition" section above. Typically, the primary constraints placed upon the constituents of body 130 are that layer 136 comprise a group III-V semiconductor having a wider band gap than the group III-V semiconductor forming layer 134, that both group III-V semiconductors be selected so as to produce 2DEG 178, and that transition layer 132 provide a suitable environment for growth of group III-V semiconductor layer 134.

In some embodiments, formation of a group semiconductor body, e.g., III-nitride semiconductor body 130, over second side 111b of silicon substrate 110 in step 230, concludes by coating III-nitride semiconductor body 130 with a capping layer (not shown in FIG. 1). A suitable material for application as a capping layer can be silicon nitride, for example, provided to seal and protect AlGaN layer 136 during subsequent group IV, e.g., silicon, processing.

Continuing with step 240 of flowchart 200, step 240 comprises processing epitaxial silicon layer 120 to fabricate a semiconductor device, such as silicon "FETKY" 160, According to the embodiment of FIG. 1, step 240 corresponds to formation of FET 140 and Schottky diode 150 that, in combination, produce FETKY 160. As shown in FIG. 1, FET 140 and Schottky diode 150 may be implemented as trench devices.

Fabrication of a trench FET, such as VET 140, is known in the art. Without delving into extensive detail, it is noted that fabrication of FET 140 may include forming P-well 122 in epitaxial silicon layer 120, forming gate trenches 144a and 144b, lining gate trenches 144a and 144b with a suitable material, filling gate trenches 144a and 144b. with, for example, polysilicon, doping the polysilicon fill, and implanting source regions 142a, 142b, 142c, and 142d. As known in the art and indicated in FIG. 1, a portion of silicon substrate 110 adjacent to second side 111b serves as drain region 116 for FET 140.

Fabrication techniques for producing trench Schottky diode 150 are also known in the art. Such techniques are described in, for example, U.S. patent application Ser. No. 6,855,593 to Alicia et al., and U.S. patent application Ser. No. 6,977,208 to Chiola, both of which are presently assigned to the assignee of the present invention and are both s hereby incorporated by reference in their entirety into the present application, Again, without delving into extensive detail, it is noted that fabrication of Schottky diode 150 may include forming diode trenches 154a and 154b in epitaxial silicon layer 120, lining diode trenches 154a and 154b with a suitable material, such as an oxide liner, filling diode trenches 154a and 154b with, for example, polysilicon, doping the polysilicon to and forming Schottky anode barrier 156 using titanium or titanium tungsten for example. As indicated in FIG. 1, the same portion of silicon substrate 110 adjacent to second side 111b serving as drain region 116 for PET 140 also serves as cathode region 116 for Schottky diode 150.

In some embodiments, fabrication of one or more silicon or other group IV semiconductor devices in step 240 concludes by covering the group IV semiconductor active layer, e.g. epitaxial silicon layer 120, with a capping layer (not shown in FIG. 1). A suitable material for application as a capping layer can be an oxide, for example, provided to seal and protect epitaxial silicon layer 120 during subsequent processing of the group III-V semiconductor body, e.g., III-nitride semiconductor body 130. It is noted that it may be advantageous for the capping materials selected for use in protecting respective group IV semiconductor active layer 120 and the group III-V semiconductor layer represented by AlGaN layer 136, be different from one another. For example, utilizing different capping materials permits removal of either one of the capping layers without compromising the protection provided by the other.

Flowchart 200 continues with step 250, which comprises processing III-nitride semiconductor body 130 to fabricate, for example, HI-nitride HEMT 170. Fabrication of III-nitride HEMT 170, during step 250, may include first stripping or otherwise modifying the protective nitride capping layer formed at the end of earlier step 230. Present step 250 may then proceed through forming of a field insulation or passivation layer, performing a GaN isolation process, opening active and contact regions for III-nitride HEMT 170, and so forth, as known in the art.

Following step 250, electrical interconnects for composite structure 100 are formed in step 260. In the example provided in FIG. 1, step 260 includes electrically coupling III-nitride, HEMT 170 to silicon FETKY 160. According to the embodiment of FIG. 1, step 260 includes formation of substrate via 112 and through-wafer via 114, as well as establishment of HEMT source contact 172, HEMT gate contact 174, HEMT drain contact 176, FET source contact 142 and Schottky anode contact 158. It is noted that in the present embodiment, HEMT source contact 172, HEMT drain contact 176, and FET source contact 142 are represented as ohmic contacts, while Schottky anode contact 158 provides a Schottky contact with Schottky diode 150. Moreover, as shown in FIG. 1, HEMT gate contact 174 may comprise a gate metal on an insulating body or make a Schottky contact with III-nitride semiconductor body 130. Moreover, although not shown in FIG. 1, FET source contact 142, or an additional FET source contact not shown, can provide electrical contact to FET source regions 142a and 142d, in addition to providing electrical contact to FET source regions 142b and 142c, which is explicitly shown in FIG. 1.

As previously explained, although not explicitly shown in FIG. 1, electrical interconnections in composite structure 100 may be provided by metallization layers not shown in FIG. 1, and the vias formed in composite structure 100. Those vias include substrate via 112 and through-wafer via 114, insulated from the and IV epitaxial layers, respectively. Although only one representation of each of substrate via 112 and through-wafer via 114 is shown in FIG. 1, it is understood that composite structure 100 may include multiple instances of one or both of substrate via 112 and through-wafer via 114 to, for example, provide additional connection points and options, improve current carrying capability, and to reduce inductance and resistance associated with these vias.

FETKY 160 is formed through parallel arrangement of FET 140 and Schottky diode 150. Electrical interconnects not explicitly shown in FIG. 1 provide electrical coupling between FET source contact 142 and Schottky anode contact 158. It is noted that region 116 serves as both a drain region for FET 140 and a cathode region for Schottky diode 150. Moreover, in the exemplary monolithic composite device shown as composite structure 100, HEMI source contact 172 is electrically coupled to HT drain and Schottky cathode region 116 of FETKY 160, through substrate via 112 (and by also utilizing additional electrical interconnects in typical metallization layers not shown). In addition, HEMT gate contact 174 is electrically coupled to both FET source contact 142 and Schottky anode contact 158, by means of through-wafer via 114 (and by also utilizing additional electrical interconnects in typical metallization layers not shown), thus completing fabrication of the exemplary monolithic vertically integrated composite structure 100 shown in FIG. 1.

Figure 3:
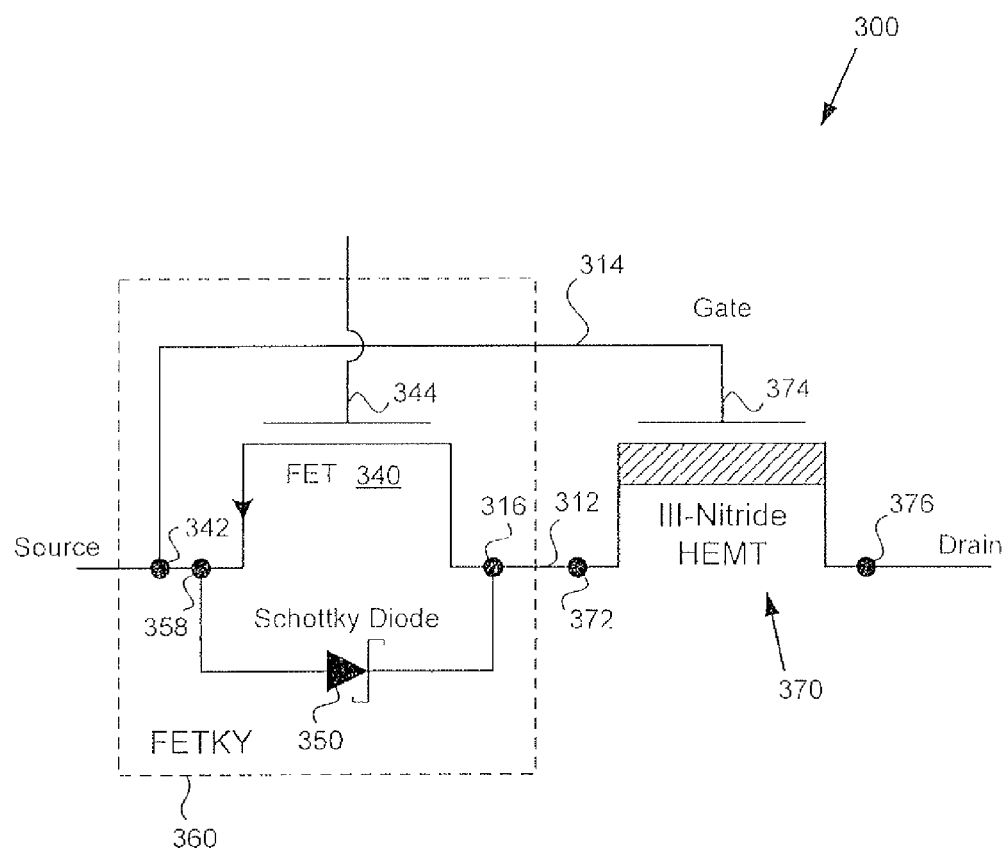
FIG. 3 is a block diagram showing a circuit corresponding to the operation of the monolithic vertically integrated composite group III-V and group IV semiconductor device of FIG. 1.

The operational advantages of the monolithic vertically integrated composite structure 100 may be more clearly appreciated by reference to FIG. 3, which shows a block diagram of a corresponding circuit. Circuit 300, in FIG. 3, shows FETKY 360 coupled to III-nitride HEMT 370. As shown in FIG. 3, FETKY 360 comprises FET 340 including source 342, and gate 344, as well as Schottky diode 350 including Schottky anode 358, which correspond respectively to FETKY 160 comprising FET 140 including FET source regions 142a, 142b, 142c, and 142d, and gate trenches 144a and 144b, as well as Schottky diode 150 including Schottky anode contact 158, in FIG. 1. FIG. 3 also shows that the drain of FET 340 and the cathode of Schottky diode 350 are coupled at node 316, corresponding to commonly shared HT drain and Schottky cathode region 116, in FIG. 1.

III-nitride HEMT 370, in FIG. 3, comprises HEMT source 372, HEMT gate 374, is and HEMT drain 376, corresponding respectively to HEMT source contact 172, HEMT gate contact 174, and HEMT drain contact 176, in FIG. 1. Circuit 300, in FIG. 3, further shows interconnects 312 and 314 providing electrical coupling of III-nitride HEMT 370 to FETKY 360, corresponding to respective substrate via 112 and through-wafer via 114, electrically coupling III-nitride HEMT 170 and silicon FETKY 160, in FIG. 1. Consistent with the previous description of the interconnections provided by respective substrate via 112 and through-wafer via 114 in FIG. 1, circuit 300 shows HEMT source 372 coupled to FET drain and Schottky cathode node 316 by interconnect 312, and shows HEMT gate 374 coupled to FET source 342 and Schottky anode 358 by interconnect 314.

As shown in FIG. 1, 2DEG 178 may be continuous under HEMT gate contact 174, indicating that III-nitride HEMT 170 corresponds to III-nitride HEMT 370 being a depletion mode device having a "normally on" state. Concurrent reference to composite structure 100, in FIG. 1, and circuit 300, in FIG. 3 reveals that the present implementation enables use of a cascoded depletion mode III-nitride HEMT 370 and FETKY 360 such that the combination of the two (i.e. the combination of the depletion mode III-nitride HEMT 370 and FETKY 360) behaves as an enhancement mode device (i.e. behave as a "normally off" switch), where gate 344, source 342, and drain 376 behave, respectively, as the gate, source, and drain of the resulting enhancement mode switch. One advantage of such an arrangement is that a low voltage silicon FETKY device can be used in high voltage applications with a power HEMT device, while retaining desirable low voltage silicon FETKY characteristics, such as low charge storage and good reverse recovery characteristics.

From the above description of the invention it is manifest that various techniques can be used for implementing the concepts of the present invention without departing from its scope. Moreover, while the invention has been described with specific reference to certain embodiments, a person of ordinary skill in the art would recognize that changes can be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

The invention claimed is:

1. A monolithic vertically integrated composite device comprising:
   a semiconductor substrate having first and second sides;
   a group IV semiconductor layer formed over said first side and comprising at least one group IV semiconductor device;
   a group III-V semiconductor body formed over said second side and comprising at least one group III-V semiconductor device electrically coupled to said at least one group IV semiconductor device;
   said semiconductor substrate being between said group IV semiconductor layer and said group III-V semiconductor body.

2. The monolithic vertically integrated composite device of claim 1, wherein said group IV semiconductor layer comprises an epitaxial layer grown over said first side.

3. The monolithic vertically integrated composite device of claim 1, further comprising a substrate via electrically coupling said at least one group III-V semiconductor device to said at least one group IV semiconductor device.

4. The monolithic vertically integrated composite device of claim 1, further comprising a through-wafer via electrically coupling said at least one group III-V semiconductor device to said at least one group IV semiconductor device.

5. The monolithic vertically integrated composite device of claim 1, wherein said group IV semiconductor layer comprises silicon.

6. The monolithic vertically integrated composite device of claim 1, wherein said group III-V semiconductor body comprises at least one III-nitride layer.

7. The monolithic vertically integrated composite device of claim 1, wherein said group III-V semiconductor body comprises a heterojunction formed at an interface of a gallium nitride (GaN) layer and an aluminum gallium nitride (AlGaN) layer.

8. The monolithic vertically integrated composite device of claim 1, wherein said group III-V semiconductor device comprises a high electron mobility transistor (HEMT).

9. The monolithic vertically integrated composite device of claim 1, wherein said group IV semiconductor device comprises a FETKY including a field-effect transistor (FET) and a Schottky diode.

10. A monolithic vertically integrated composite device comprising:
    an SOI substrate having a first side and a second side;
    a group IV semiconductor layer formed over said first side of said SOI substrate and comprising at least one group IV semiconductor device;
    a group III-V semiconductor body formed over said second side of said SOI substrate and comprising at least one group III-V semiconductor device electrically coupled to said at least one group IV semiconductor device;
    said SOI substrate being situated between said group IV semiconductor layer and said group III-V semiconductor body.

11. The monolithic vertically integrated composite device of claim 10, wherein said SOI substrate comprises an insulator situated between said first side and said second side of said SOI substrate, and wherein both said first and second sides comprise silicon.

12. The monolithic vertically integrated composite device of claim 10, wherein said group IV semiconductor layer comprises an epitaxial layer grown over said first side.

13. The monolithic vertically integrated composite device of claim 10, further comprising a substrate via electrically coupling said at least one group III-V semiconductor device to said at least one group IV semiconductor device.

14. The monolithic vertically integrated composite device of claim 10, further comprising a through-wafer via electrically coupling said at least one group III-V semiconductor device to said at least one group IV semiconductor device.

15. The monolithic vertically integrated composite device of claim 10, wherein said group IV semiconductor layer comprises silicon.

16. The monolithic vertically integrated composite device of claim 10, wherein said group III-V semiconductor body comprises at least one III-nitride layer.

17. The monolithic vertically integrated composite device of claim 10, wherein said group III-V semiconductor body comprises a heterojunction formed at an interface of a gallium nitride (GaN) layer and an aluminum gallium nitride (AlGaN) layer.

18. The monolithic vertically integrated composite device of claim 10, wherein said group III-V semiconductor device comprises a high electron mobility transistor (HEMT).

19. The monolithic vertically integrated composite device of claim 10, wherein said group IV semiconductor device comprises a FETKY including a field-effect transistor (FET) and a Schottky diode.

* * * * *

UNITED STATES PATENT AND TRADEMARK OFFICE
CERTIFICATE OF CORRECTION

| | |
|---|---|
| PATENT NO. | : 8,866,193 B2 |
| APPLICATION NO. | : 14/049564 |
| DATED | : October 21, 2014 |
| INVENTOR(S) | : Michael A. Briere |

Page 1 of 1

It is certified that error appears in the above-identified patent and that said Letters Patent is hereby corrected as shown below:

On the Title Page, Item (54) and in the Specification, Col. 1 lines 1-4, Title, "Method for Fabricating a Monolithic Integrated Composite Group III-V and Group IV Semiconductor Device" should be changed to --Monolithic Integrated Group III-V and Group IV Device--.

Signed and Sealed this
Thirtieth Day of December, 2014

Michelle K. Lee
*Deputy Director of the United States Patent and Trademark Office*